United States Patent [19]

Sauerland

[11] Patent Number: 5,451,884

[45] Date of Patent: Sep. 19, 1995

[54] ELECTRONIC COMPONENT TEMPERATURE TEST SYSTEM WITH FLAT RING REVOLVING CARRIAGE

[75] Inventor: Franz L. Sauerland, Chagrin Falls, Ohio

[73] Assignee: Transat Corp., Solon, Ohio

[21] Appl. No.: 102,157

[22] Filed: Aug. 4, 1993

[51] Int. Cl.⁶ .................... G01R 31/00; G01R 29/22
[52] U.S. Cl. .................. 324/760; 324/73.1; 324/158.1; 324/727
[58] Field of Search ............ 324/760, 73.1, 158.1, 324/727, 537, 754, 755; 209/573; 198/394

[56] References Cited

U.S. PATENT DOCUMENTS

| | | | |
|---|---|---|---|
| 3,039,058 | 6/1962 | Huband et al. | 324/760 |
| 3,039,604 | 6/1962 | Bickel et al. | 209/573 |
| 3,094,212 | 6/1963 | Moore et al. | 209/573 |
| 3,579,102 | 5/1971 | Keating et al. | 209/573 |

*Primary Examiner*—Ernest F. Karlsen

[57] ABSTRACT

A carriage or dielectric disk (40) has a series of electrical contacts (46, 48) defined by conventional circuit board techniques on upper and lower surfaces around a peripheral edge. Sockets (42, 44) are wave soldered in electrical connection with the electrical contacts. At least the electrical contacts are plated with a hard, dense metal, such as nickel. When components have been frictionally inserted into the sockets, the carriage is placed in a cooling chamber (18). Air of a selected temperature is blown through a central port (22) and directed to flow over the surface of the carriage and the supported components (10). A motor (60) rotates the carriage to move the electrical contacts (46, 48) successively into electrical communication with relatively soft electrical contact springs (58) connected with a test instrument (32). The test circuit measures electrical characteristics or properties of each component at each of a plurality of preselected temperatures. Based on the measured properties, the components are sorted.

20 Claims, 4 Drawing Sheets

ELECTRONIC COMPONENT TEMPERATURE TEST SYSTEM WITH FLAT RING REVOLVING CARRIAGE

BACKGROUND OF THE INVENTION

The present invention relates to the art of electronic component testing. It finds particular application in conjunction with temperature testing of electronic quartz resonators which have a temperature dependent frequency and will be described in the following specification with particular reference thereto. It is to be appreciated, however, that the invention will also find application in conjunction with the testing of other electronic components, both for temperature dependent and other characteristics.

Heretofore, the frequency response of the resonators was measured at a plurality of temperatures to determine frequency response characteristics. Typically, the frequency response was measured three or more times in a temperature range between −50° C. and +150° C. Of course, because the measured response is temperature dependent, accurate measurement of the response requires accurate control of the temperatures to which the components are heated or cooled for testing.

In order to test large numbers of components efficiently, various batch and in-line systems have been developed. In batch systems, the batch of components are all heated or cooled to the same temperature concurrently. The components in the temperature chamber are either stationarily positioned and switched into electrical communication with the test equipment or moved through the temperature chamber to a designated test location. In one prior art batch system with mobile component positioning illustrated in FIG. 1, a multiplicity of components were mounted by hand in sockets facing an inner surface of a cylindrical ring 12 of about 30 centimeters in diameter. The sockets were connected with a series of contact pins 14 which extended radially outward from an outer surface of the cylindrical ring. Once the components were manually loaded into the cylindrical ring, the cylindrical ring was mounted on a motor shaft 16 in a temperature chamber To cool the components, a compressed gas or other coolant from a coolant source 20 was released and controlled by a control valve 22 and pumped into the chamber through a central outlet or port 24 by a blower 26. Once the components were cooled to the selected temperature, the motor shaft 16 was rotated or indexed to bring each of the contact pins 14 into electrical connection with electrical connectors 28. The connectors 28 connected a measurement network 30 and a test instrument 32 with the contact pins 14. After all of the components were tested, the blower blew air across a heater element 34 to warm the components and the test chamber to the next preselected test temperature. A temperature sensor 36 measured the temperature in the test chamber during both cooling and heating cycles and controlled the heater element 32 and the control valve 22 for the coolant source 20 to maintain a constant selected temperature. The cylindrical ring 12 was again rotated and each of the components tested. This same process was repeated at each of the preselected temperatures. After each of the components was tested at each of the temperatures, the components were manually removed and sorted in accordance with the test results.

One of the disadvantages of this system is that the hand insertion, extraction, and sorting was time consuming and expensive. Another disadvantage resided in the wear of the contact pins 14. Typically, the contact pins wore out and required repair or replacement in about a year. Another disadvantage was that part of the hot and cold air could circulate directly from the central port 24, across the temperature sensor 36, and out a return port 38 without reaching the components, causing a reduced efficiency and reliability.

A further disadvantage is that the cylindrical test carriage 12 was expensive and time-consuming to build. A pair of machined profile rings defined the wall of the cylinder to which PC boards were bent and riveted. The boards had an etched pattern for component sockets.

In addition to the temperature testing, the resonators were commonly tested at room temperature for various operating parameters and characteristics. The resonators were moved from the cylindrical carriage used in the temperature testing assembly into a different carriage. One disadvantage, of course, is the time and expense involved in moving the components among test fixtures.

Due to the sensitive nature of the measurements, changes in contact resistance could cause significant errors in the measured parameters and characteristics. As the contacts on the test fixtures wore, it became more difficult to make good, reliable, electrical communication therewith for testing. The lack of assured consistency in the contact resistance was another significant drawback to the prior art systems.

The inconsistent electrical contact resistance is due to serration of the contact pins caused by the cutting action of the contact springs. The resistances may vary from tens of milliohms to several ohms. Depending on wear of the pins, the resistance sometimes increases to infinity, i.e. there is no contact at all. These resistance variations are especially unacceptable for measuring crystal parameters other than the crystal frequency. These parameters are usually measured at room temperature after extracting the crystals from the temperature test ring and inserting them into a separate test system. If the parameters could be measured accurately while still in the ring, they could be measured either in the temperature chamber or, after transfer of the ring, in a separate test system. Either approach would save time and equipment costs. The present invention provides a new and improved system which overcomes the above-referenced problems and others.

SUMMARY OF THE INVENTION

In accordance with one aspect of the present invention, a test system for electrical components is provided. A carriage for carrying a plurality of components to be tested includes a flat disk-shaped member having a substantially circular periphery. A first series of electrical contacts are disposed along a first surface of the disk-shaped member adjacent the circular periphery. A second series of electrical contacts are disposed along a second surface of the disk-shaped member adjacent the circular periphery. A plurality of sockets for removably receiving electrical components to be tested are disposed in a circular ring along the disk-shaped member and in electrical connection with the first and second series of contacts. A turntable means rotatably supports the carriage. An electrical connection means connects each of the first and second series of contacts with a means for measuring electrical characteristics of the components.

In accordance with a more limited aspect of the present invention, the turntable is disposed in a temperature chamber. A temperature control means controls the temperature in the temperature chamber.

In accordance with another more limited aspect of the present invention, the electrical connection means includes electrical contact elements or springs of relatively soft conductive material which engage the first and second series of electrical contacts. The electrical contacts are coated with a conductive material that is hard relative to the contact elements. In this manner, the series of electrical contact elements on the carriage suffer substantially no wear as compared to the electrical contact elements which are easily replaced.

In accordance with another more limited aspect of the present invention, the disk member includes a planar ring of dielectric material having a cutout notch.

In accordance with another aspect of the present invention, a robotic arm assembly selectively loads electrical components into the sockets, removes the components from the sockets, and sorts the components in accordance with the test.

In accordance with another aspect of the present invention, a test system for electrical components is provided. A carriage which carries a plurality of components includes a first series of electrical contacts having a relatively hard surface and a second series of electrical contacts also having a relatively hard surface. A plurality of sockets for removably receiving electrical components to be tested are electrically connected with the first and second series of contacts. A turntable means rotatably supports the carriage. First and second electrically conductive spring members of a relatively soft electrically conductive material are mounted such that the first spring member is biased into frictional contact with the first series of electrical contacts and the second spring member is biased in frictional contact with the second series of electrical contacts. In this manner, the relatively hard surface of the first and second series of electrical contacts and the relatively soft material of the spring members cause the spring members to wear while the first and second series of contacts suffer only minimal wear. An electrical characteristic measurement network is connected with the spring members for sequentially measuring characteristics of the components received in the sockets.

In accordance with another aspect of the present invention, the disk-shaped member of the carriage includes a planar disk of dielectric material on which the first and second series of electrical contacts are formed and defined using circuit board layering and etching techniques. The sockets are mounted in a circular ring along the dielectric disk and connected electrically to portions of the first and second series of electrical contacts.

In accordance with another aspect of the present invention, a method of testing electronic components is provided. A thin layer of conductive material is laminated at least along a circular periphery on opposite surfaces of a generally planar, circular disk. The conductive metal layer is etched into a series of electrically isolated electrical contacts on the opposite surfaces along the circular periphery. Component lead receiving sockets are mounted to the dielectric disk adjacent the electrical contacts and are electrically connected to the contacts. Electrical components are mounted in the sockets and the disk is mounted on a rotatable turntable. The disk is rotated such that the series of electrical contacts are rotated successively into electrical contact with an oppositely disposed pair of sliding electrical contact springs which are connected with a test instrument which measures electrical characteristics. The disk is rotated such that the series of electrical contacts are brought progressively into contact with the oppositely disposed pair of electrical contact springs and each component is tested with the test instrument.

In accordance with another aspect of the present invention, a method of testing electrical components is provided. Electrical components are inserted into sockets mounted in a circular ring around a flat, dielectric disk. The sockets are connected with at least two adjacent series of electrical contacts arranged in circular rings on the flat dielectric disk. The disk is rotated such that the electrical contacts are rotated successively into electrical contact with electrical contact elements which are connected with a test instrument. The electrical components are brought into temperature equilibrium at each of a plurality of temperatures. At each of the pluralities of temperatures, the disk is rotated such that the first and second series of electrical contacts are brought progressively into electrical contact with the electrical contact elements. Each associated component is tested with the test instrument.

In accordance with another aspect of the present invention, a method of testing electrical components is provided. Electrical components are inserted into sockets of a circular carrier. The sockets are connected with at least two series of electrical contacts arranged peripherally around the carrier. The two series of a contacts have a relatively hard conductive surface. The disk is rotated such that the electrical contacts are rotated successively into frictional contact with electrically conductive spring members which are connected with test instrument for testing electrical parameters. The spring members are of a relatively soft material such that the frictional contact of the spring members and the electrical contacts wears the spring members and leaves the electrical contacts with minimal wear. When the spring members are in contact with the electrical contacts, each associated component is tested with the test instrument to obtain its electrical parameters.

One advantage of the present invention is that it provides a low and consistent contact resistance which does not deteriorate with wear.

Another advantage of the present invention is that it is readily amenable to automation both in manufacture and use. The flat disk-shaped carriage is amenable to be produced by automated manufacturing techniques. Components are readily inserted prior to temperature testing and extracted and sorted after temperature testing by conventional, robotic devices.

Another advantage of the present invention is that it is relatively simple, long-lived, and cost-effective.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
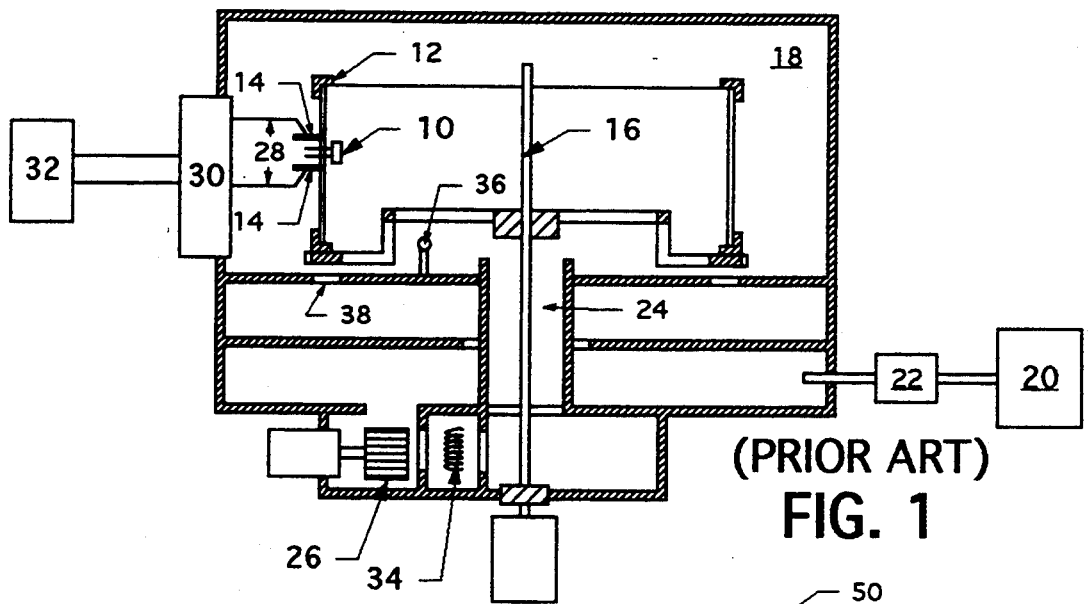
FIG. 1 is a cross-sectional illustration of a prior art temperature test system.
Figure 2:
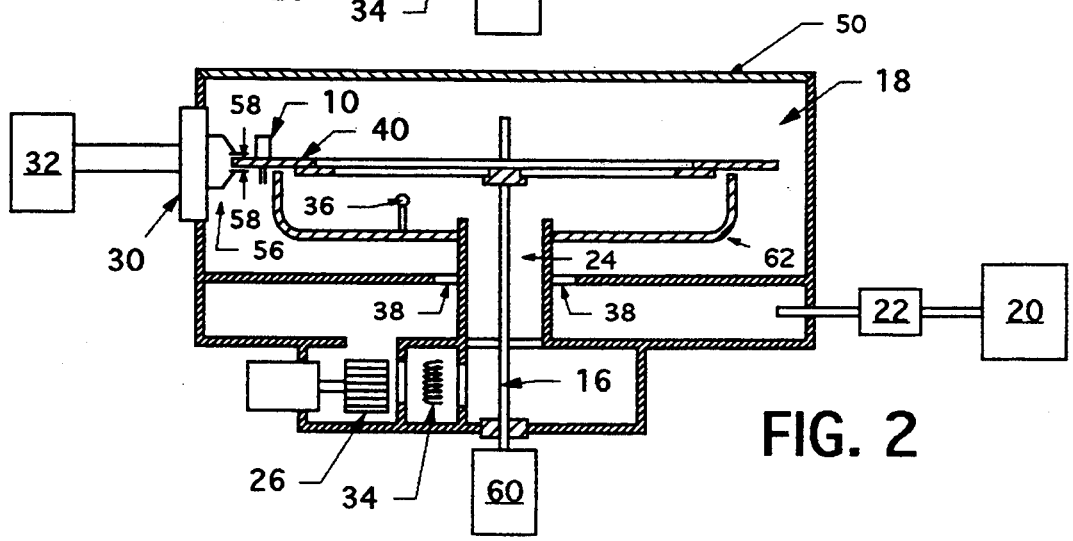
FIG. 2 is a cross-sectional view of a temperature test system in accordance with the present invention.
Figure 3A:
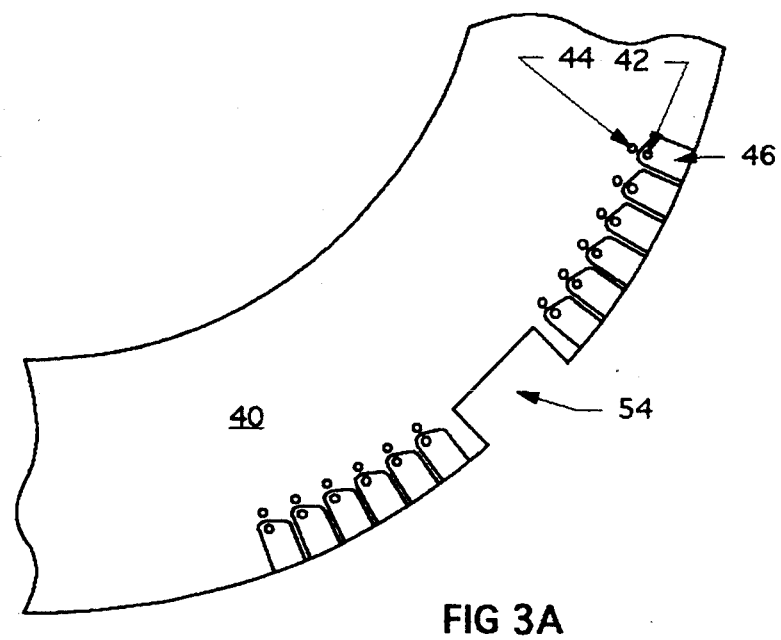
FIGS. 3A and 3B are top and bottom views of a segment of the component carriage ring of FIG. 2.
Figure 3B:
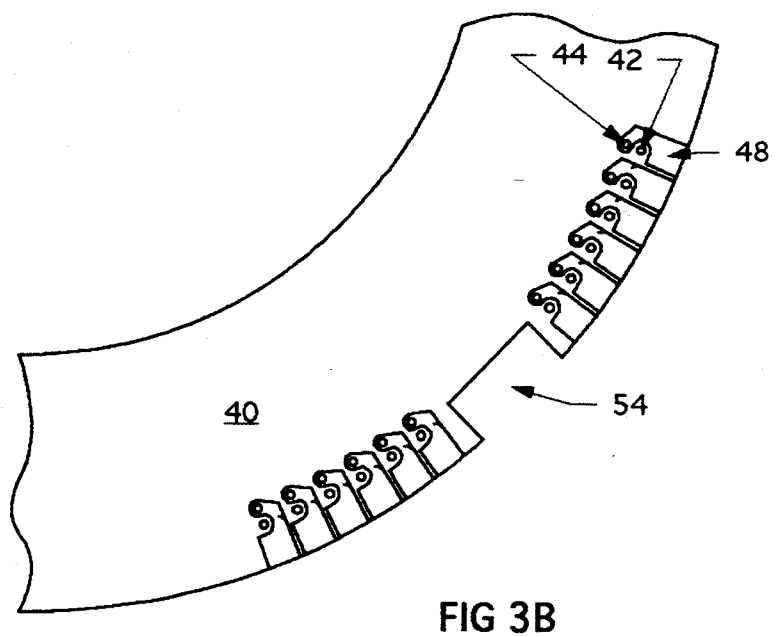

With reference to FIGS. 2, 3A, and 3B, a plurality of components 10 are supported on a carriage, more specifically a flat dielectric ring or disk 40. Leads of each component are inserted in sockets 42 and 44. Optionally, two or more pairs of sockets may be provided to accommodate components with a variety of lead configurations. Sockets 42 are connected with a first series of electrical contacts 46 on one face of the dielectric disk. Sockets 44 are connected with a second series of electrical contacts 48 on the opposite face of the dielectric disk.

Looking to the manufacture of the carriages, the series of electrical contacts 46, 48 are defined using conventional circuit board laminating and etching techniques. Sockets are mounted to the dielectric disk in electrical contact with a pair of the contacts 46, 48. In the illustrated embodiment, socket pins 42, 44 are frictionally inserted in the bores and wave soldered to the electrical contacts. In this manner, the multiplicity of sockets are readily soldered into place and electrically connected with the associated series of electrical contacts. Other types of sockets and component mounts, such as for surface mounted components, as may be appropriate to the tested components can also be mounted to the dielectric disk. For longer life, the electrical contacts 46, 48 are preferably plated with a durable, friction resistant metal, such as nickel.

Figure 4:
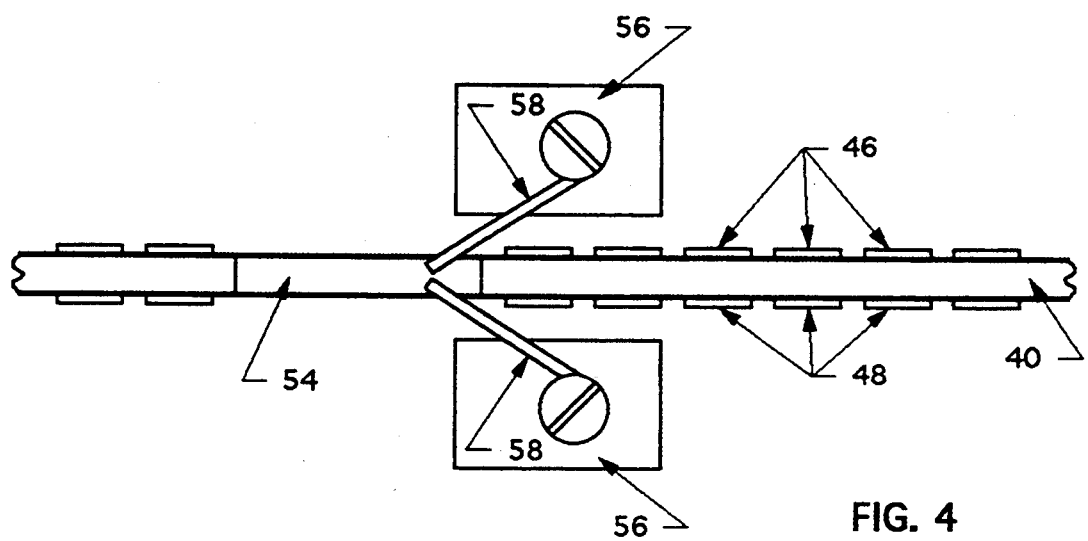
FIG. 4 is a side view of a portion of the component carriage ring and electrical contact spring members.

Once the components are mounted in the sockets, a cover 50 of a temperature chamber 18 is lifted and the dielectric carriage disk 40 is positioned on a turntable means 52. With continuing reference to FIGS. 3A and 3B and further reference to FIG. 4, an edge cutout 54 in the dielectric disk passes over an electrical connection means or assembly 56. The electrical connection assembly 56 includes a pair of electrical contact elements, preferably springs 58, constructed of a metal which is relatively soft compared to the nickel plating. In the preferred embodiment, the electrical contact elements are leaf springs which are mounted with a sloping or ramp surface. The electrical contact springs are received in the edge cutout 54 and urged apart by the rotation of the disk. The contact springs or elements are mounted with a mechanical attachment that facilitates easy replacement. In this manner, the contact springs wear out long before the series of contacts 46, 48 on the dielectric disk, but are easily and inexpensively replaced. Conversely, the series of contacts 46, 48 are highly resistant to the surface deformation caused by wear and the variation in contact resistance associated with contact surface deformation.

With reference again to FIG. 2, the cover 50 is closed and a motor 60 rotates a drive shaft 16, the turntable means 52, and the carriage 40. A source of coolant 20 controlled by a valve 22 releases coolant which is circulated by a fan 26 through a vertical, central inlet bore 24 to the temperature chamber 18. A baffle 62 has an upper horizontal edge which directs the cooling fluid through central apertures in the turntable 52 and carriage 40, over the top surface of the carriage, cooling the components 10 before returning to a return port 38 to the fan 26. In this manner, the baffle 62 separates the central port 24 and the return port 38, forcing the circulating air to go over the components. A temperature sensor 36 is supported on the baffle 62 for sensing temperature in the temperature chamber 18.

The motor 60 indexes the series of electrical contacts 46, 48 associated with each of the components 10 into electrical contact with the contact springs 58. The contact springs are connected with a measurement network 30 and an electrical test instrument 32. Each component is tested at the temperature measured by temperature sensor 36. The test instrument 32 stores the measured results for each component at the measured temperature.

Thereafter, a heating coil 34 heats the air circulated by the fan 26 until the temperature of the components and the test chamber is brought into equilibrium with a second preselected test temperature. The motor 60 again rotates the turntable and carriage 40 permitting the measurement network 30 and the test instrument 32 to test each component at the second test temperature.

The heating coil 34 heats the air from the fan 26 until the test chamber 18 and components 10 are brought to thermal equilibrium at a next preselected test temperature. The motor 60 again rotates the turntable and carriage ring, enabling the measurement network 30 and the test instrument 32 to test each component at the third preselected temperature. This process is repeated for a preselected number of temperatures and the measured test value for each component is stored for each temperature. The test instrument then calculates temperature dependent characteristics of each component from the three or more measurements stored for each of the components.

Figure 5:
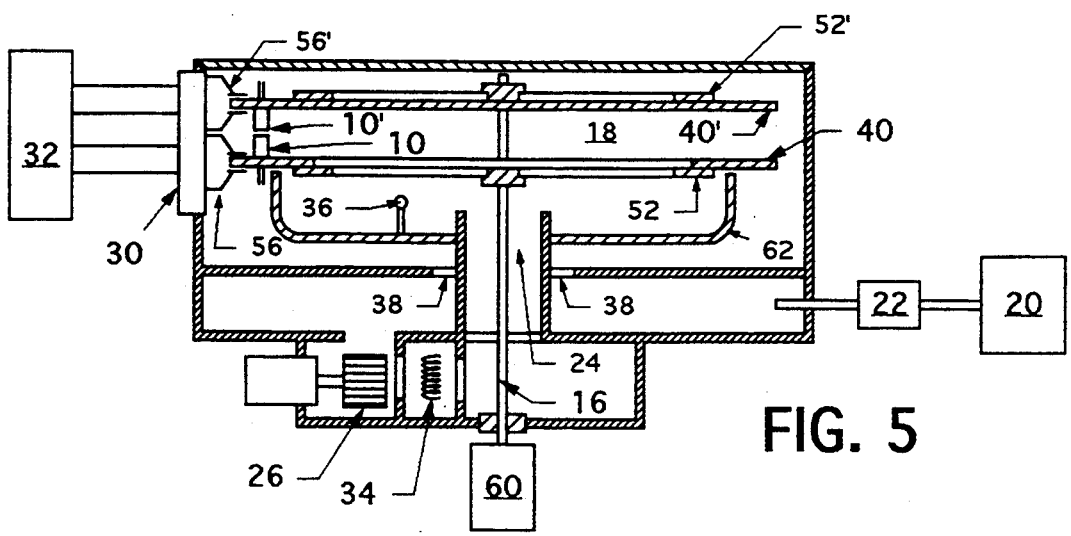
FIG. 5 is an alternate embodiment of the present invention in which components in multiple ring carriages are tested concurrently; and, FIG. 6 is another alternate embodiment of the present invention in which the insertion, extraction, and sorting of components is automated.

While the equipment described in FIGS. 2–5 is useful for measuring the frequency dependence of crystals, it can also be used to accurately measure other crystal parameters, such as the crystal resistance, inductance, and the static and dynamic crystal capacitances. This is because, contrary to prior art, the contact resistance is consistent as well as small (approx. 18 milliohms) compared to crystal resistance, which may range from a few ohms to hundreds of ohms. The measurements can be done in the temperature chamber or, for room temperature measuring, in a system such as per FIG. 2 but without the provisions for temperature change. With reference to FIG. 5, the motor 60 has an elongated drive shaft 16 constructed to receive a pair of turntables 52, 52' which support a pair of carriages 40, 40'. Preferably, the upper carriage 40' is mounted such that the components 10' face downward adjacent the components 10 of the first carrier. By placing the components in closer physical proximity, temperature equilibrium between components of the two carriages is promoted. Preferably, the upper carriage 40' includes a solid dielectric disk to deflect the temperature changing air which flows up central port 22 across the components. A pair of electrical connection means 56, 56' have contact springs which contact the series of electrical contacts on the two dielectric disks such that measurement network 30 and the electrical test instrument 32 can measure their properties.

Figure 6:
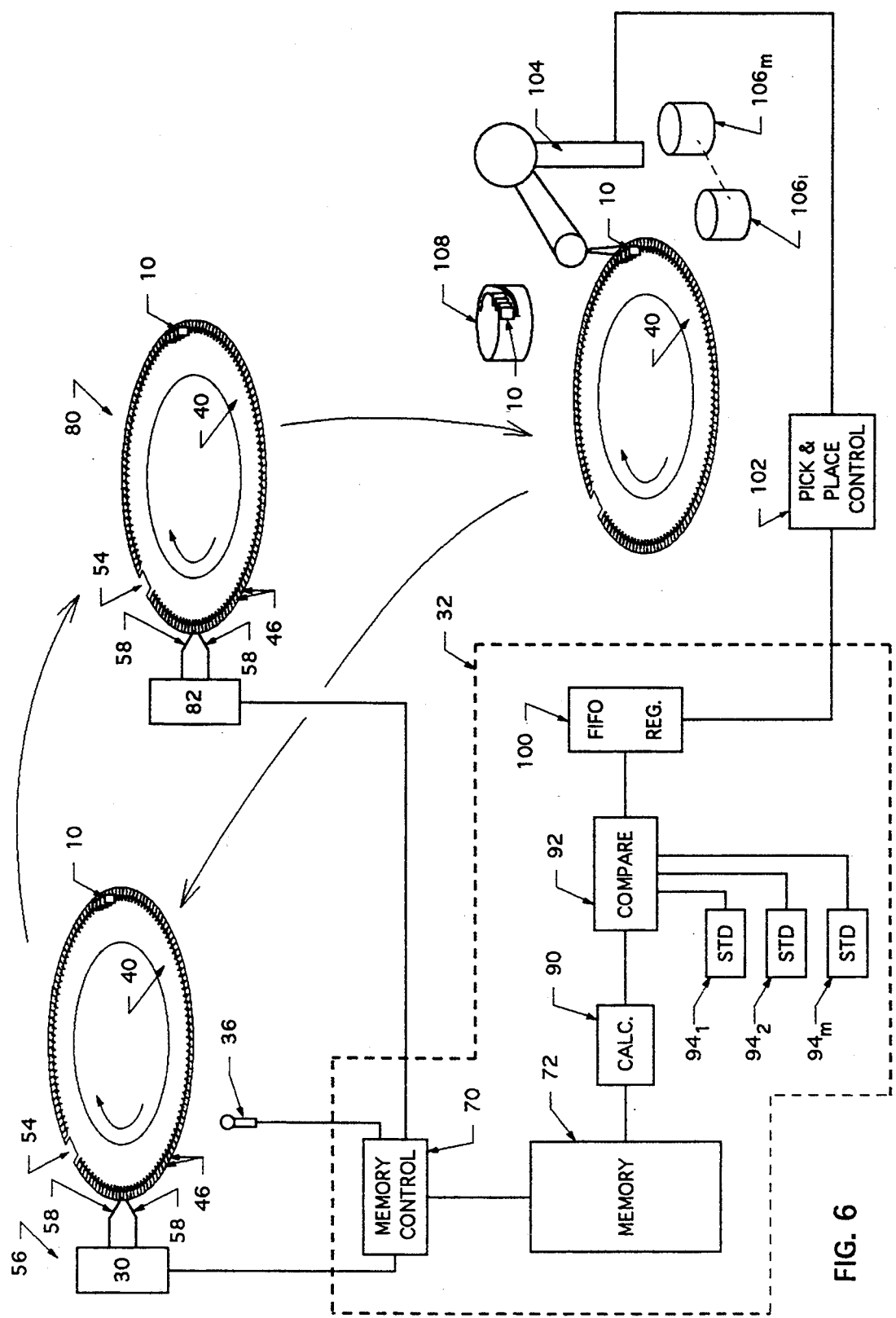

With reference to FIG. 6, the test instrument 32 includes a memory control 70 which loads a memory with the test values measured at each of the test temperatures for each of components 1—N. Conventionally, addition parameters are at room temperature. The test components are preferably numbered sequentially from a preselected point on the carriage ring, such as starting at the notch 54. After the temperature dependent testing, the carriage 40 is moved to a non-temperature dependent parameter characteristic test station 82. Electrical leaf spring contacts 58' connect the series of electrical contacts 46, 48 with a non-temperature dependent parameter characteristic measurement network 82. The electrical measurement network 82 measures the non-temperature dependent characteristics of each crystal and conveys the parameter characteristics to the memory control 70 and memory 72.

Once the temperature dependent and non-temperature dependent test values have been collected for each of the components, a calculating means 90 calculates the temperature and non-temperature dependent characteristics of each component. A comparing means compares each calculated characteristic with a series of standards $94_1, \ldots, 94_m$ and produces an indication of into which category or class each component falls. The list of the component categories is stored in a FIFO register means 100 in order. A pick and place controller 102 receives the component category information from the FIFO register means 100 in the order that the components are received and causes a robot arm 104 to remove each component from the disk and deposit it in a corresponding receptacle or other receiving means $106_1, \ldots, 106_m$ for category and class. The pick and place control means 102 also controls the robot arm 104 to take a not yet tested component from a component source 108 and place it into each empty socket on the carriage ring. The carriage ring 40 is then returned to the temperature test station and the cycle repeated.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A test system for electrical components, the test system comprising:
    a carriage for carrying a plurality of components to be tested, the carriage including:
        a flat disk-shaped member having a substantially circular periphery,
        a first series of electrical contacts disposed adjacent the circular periphery of the disk-shaped member,
        a second series of electrical contacts disposed adjacent the circular periphery of the disk-shaped member,
        a plurality of sockets for removably receiving electrical components to be tested, the sockets being disposed on the disk-shaped member and electrically connected with the first and second series of contacts;
    a turntable means for rotatably supporting the carriage;
    an electrical connection means for sequentially connecting each of the first and second series of electrical contacts with an electrical characteristic measurement means for measuring electrical characteristics of the components.

2. A test system for electrical components, the test system comprising:
    a carriage for carrying a plurality of components to be tested, the carriage including:
        a first series of electrical contacts having a relatively hard surface,
        a second series of electrical contacts having a relatively hard surface,
        a plurality of sockets for removably receiving electrical components to be tested, the sockets being electrically connected with the first and second series of contacts;
    a turntable means for rotatably supporting the carriage;
    first and second electrically conductive spring members of a relatively soft electrically conductive material, the first and second spring members being mounted such that the first spring member is biased into frictional contact with the first series of electrical contacts and the second spring member is biased into frictional contact with the second series of electrical contacts, such that the relatively hard surface of first and second series of electrical contacts and the relatively soft material of the spring members cause the spring members to wear, with minimal wear on the first and second series of contacts;
    an electrical characteristic measurement means connected with the spring members for sequentially measuring characteristics of the components received in the sockets.

3. A carriage for carrying electrical components in a test system, the carriage comprising:
    a carriage body having a circular periphery;
    a first series of electrical contacts disposed adjacent the carriage body circular periphery;
    a second series of electrical contacts disposed adjacent the carriage body circular periphery;
    the first and second series of electrical contacts having a surface of a relatively hard conductive material as compared to electrical contact elements that selectively make rubbing friction contact therewith such that relative wear between the first and second series of electrical contacts and the electrical contact elements causes the electrical contact elements to wear, rather than the first and second series of contacts;
    a plurality of sockets for removably receiving electrical components to be tested, the sockets being disposed on the carriage body concentric with the circular periphery and electrically connected with the first and second series of contacts.

4. A method of testing electronic components, the method comprising:
    inserting electrical components into sockets of a circular carriage, the sockets being connected with at least two series of electrical contacts arranged peripherally around the carriage, the two series of electrical contacts having a relatively hard conductive surface;

rotating the carriage such that the electrical contacts are rotated successively into frictional contact with electrically conductive spring members which are connected with a test instrument for testing electrical parameters, the spring members being of relatively soft material such that the frictional contact of the spring members and the electrical contacts wears the spring members and leaves the electrical contacts with minimal wear;

as the spring members come in sequential contact with the electrical contacts, testing each associated component with the test instrument to obtain the electrical parameters.

5. The method as set forth in claim 4 wherein the turntable is disposed in a test chamber and further including:

adjusting the temperature test chamber to bring the electrical components into temperature equilibrium at each of a plurality of temperatures and repeating the steps of rotating the disk and testing the components at each of the plurality of temperatures.

6. A method of testing the temperature dependence of electronic components, the method comprising:

providing a flat dielectric disk having oppositely disposed first and second faces and a circular peripheral edge, at least first and second series of electrical contacts being arranged peripherally on the flat dielectric disk along the peripheral edge with at least one of the series of contacts being disposed on the first disk face, a plurality of sockets for receiving components being electrically connected with the electrical contacts;

inserting electronic components into the sockets such that each electronic component is connected with one of the first series of contacts and with one of the second series of contacts;

removably mounting the flat disk on a rotary turntable in an environmental test chamber;

in the environmental test chamber, rotating the disk such that the electrical contacts are rotated successively into electrical connection with electrical contact elements which are connected with a test instrument for testing electrical parameters;

changing temperature in the environmental test chamber to each of a plurality of temperatures and bringing the electronic components into temperature equilibrium at each of the plurality of temperatures;

at each of the plurality of temperatures, rotating the disk such that the first and second series of electrical contacts are brought progressively into electrical connection with the electrical contact elements and testing each associated electronic component with the test instrument to obtain temperature dependence of the electrical parameters.

7. The method as set forth in claim 6 wherein the disk has a notch along its peripheral edge and the electrical contact elements include an oppositely disposed pair of electrical contact springs and wherein:

during the step of inserting the disk into the environmental test chamber, the pair of electrical spring contacts are passed through the notch.

8. The method as set forth in claim 7 wherein the first series of electrical contacts are disposed on the first face of the flat dielectric disk and the second series of electrical contacts are mounted on the second face of the flat dielectric disk and wherein the rotating step includes:

camming the oppositely disposed pair of electrical springs contacts apart with an edge of the dielectric disk that defines the notch; and, as the disk rotates, with the electrical contact springs concurrently engaging an electrical contact of the first series and an electrical contact of the second series which contacts are connected with one of the electronic components such that the one electronic component is connected with the test instrument.

9. The method as set forth in claim 6 wherein the electrical elements include an oppositely disposed pair of electrical contact springs and wherein the rotating step includes:

as the disk rotates, concurrently camming the oppositely disposed pair of electrical contact springs into an electrical contact of the first series and an electrical contact of the second series which are connected with one of the electronic components such that the electronic component is connected with the test instrument.

10. The method as set forth in claim 9 wherein the electrical contacts are harder than the oppositely disposed pair of electrical contact springs such that the electrical contacts are resistant to wear.

11. The method as set forth in claim 10 wherein the step of providing the flat electrical disk includes coating the electrical contacts with nickel such that the electrical contacts are harder than the electrical contact springs.

12. The method as set forth in claim 6 wherein the step of providing the disk includes:

laminating a thin layer of conductive metal adjacent at least the circular peripheral edge of each of the first and second faces of the flat dielectric disk;

etching the conductive metal layers into the first and second series of electrical contacts;

mounting the sockets to the dielectric disk adjacent the electrical contacts;

connecting each socket to one of the electrical contacts.

13. The method as set forth in claim 6 further including:

providing a second flat dielectric disk having oppositely disposed faces with at least two series of electrical contacts being arranged peripherally on the flat dielectric disk and a plurality of sockets for receiving components being electrically connected with the electrical contacts;

inserting electronic components into the sockets of the second dielectric disk;

inserting the second dielectric disk into the environmental chamber such that the first and second disks are stacked in alignment.

14. The method as set forth in claim 6 wherein the step of inserting electronic components into the sockets is performed robotically and further including:

robotically removing components from the sockets.

15. The method as set forth in claim 14 further including:

as the electronic components are robotically removed from the sockets, sorting the electronic components in accordance with electrical parameters tested by the test instrument.

16. The method as set forth in claim 6 wherein the electronic components are quartz crystal elements.

17. The method of testing electronic components as set forth in claim 4 further including:

prior to the inserting step fabricating the carrier including the steps of:

laminating a thin layer of conductive metal at least along a circular periphery of opposite surfaces of a generally planar, circular dielectric disk;

etching the conductive metal layer into series of electrically isolated electrical contacts on the opposite surfaces along the circular periphery;

mounting component lead receiving sockets to the dielectric disk adjacent the series of electrical contacts;

connecting the sockets to the electrical contacts;

after the inserting step:

mounting the disk on a rotatable turntable.

18. The method as set forth in claim 17 further including plating the series of electrical contacts with a metal that is harder than the electrical contact springs such that the sliding electrical contact causes wear of the electrical contact springs and not the series of electrical contacts.

19. A method of testing temperature dependent electronic components, the method comprising:

inserting electrical components into sockets of a circular carriage, the sockets being connected with at least two series of electrical contacts arranged peripherally around the carriage, the two series of electrical contacts having a relatively hard conductive surface;

rotating the carriage such that the electrical contacts are rotated successively into frictional contact with electrically conductive spring members which are connected with a test instrument for testing temperature dependent electrical parameters, the spring members being of relatively soft material such that the frictional contact of the spring members and the electrical contacts wears the spring members and leaves the electrical contacts with minimal wear;

bringing the electrical components into temperature equilibrium at each of a plurality of temperatures;

at each of the plurality of temperatures, rotating the disk such that the first and second series of electrical contacts are brought progressively into electrical connection with the spring members;

as the spring members come in sequential contact with the electrical contacts, testing each associated component with the test instrument to obtain the temperature dependent electrical parameters.

20. The method as set forth in claim 19 wherein the first and second series of electrical contacts are mounted directly on the first and second faces of the flat dielectric disk and further including squeezing the electrical contacts and the dielectric disk between the pair of electrical spring contacts.

* * * * *